United States Patent
von Deuster et al.

(10) Patent No.: US 11,231,478 B2
(45) Date of Patent: Jan. 25, 2022

(54) MINIMIZATION OF SIGNAL LOSSES IN MULTI-ECHO IMAGING

(71) Applicant: Siemens Healthcare GmbH, Erlangen (DE)

(72) Inventors: Constantin von Deuster, Zurich (CH); George William Ferguson, Erlangen (DE); Michael Koehler, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 19 days.

(21) Appl. No.: 16/832,060

(22) Filed: Mar. 27, 2020

(65) Prior Publication Data

US 2020/0309886 A1 Oct. 1, 2020

(30) Foreign Application Priority Data

Mar. 27, 2019 (EP) ..................... 19165565

(51) Int. Cl.
*G01R 33/561* (2006.01)
*G01R 33/54* (2006.01)
*G01R 33/565* (2006.01)

(52) U.S. Cl.
CPC ....... *G01R 33/5617* (2013.01); *G01R 33/543* (2013.01); *G01R 33/56518* (2013.01); *G01R 33/56581* (2013.01)

(58) Field of Classification Search
CPC .............. G01R 33/5617; G01R 33/543; G01R 33/56581; G01R 33/56518; G01R 33/5616; G01R 33/3607
See application file for complete search history.

(56) References Cited

U.S. PATENT DOCUMENTS

| 5,623,207 | A | 4/1997 | Weissenberger et al. |
| 2010/0237865 | A1* | 9/2010 | Stemmer ............ G01R 33/5611 324/309 |
| 2017/0082710 | A1* | 3/2017 | Zeller .................. G01R 33/546 |

OTHER PUBLICATIONS

Zhou, Tan, Bernstein: "Artifacts induced by concomitant magnetic field and in fast spin-echo imaging"; Magnetic Resonance in Medicine, vol. 40, p. 582-591 (1998).
Bernstein, Matt A. et al. "Handbook of MRI Pulse Sequences", Elsevier, 2004.
European Search Report dated Sep. 27, 2019, Application No. 19165565.3.

* cited by examiner

*Primary Examiner* — Rishi R Patel
(74) *Attorney, Agent, or Firm* — Schiff Hardin LLP

(57) ABSTRACT

Techniques are disclosed for acquiring MR signals of an object under examination in an MR system using a multi echo imaging sequence. The method comprises the steps of applying an RF excitation pulse to the object to generate a transverse magnetization, applying at least two RF refocusing pulses for refocusing the transverse magnetization to generate at least two MR spin echoes for the RF excitation pulse, applying a first magnetic field gradient in a read out direction between the RF excitation pulse and the first of the at least two RF refocusing pulses, applying a second magnetic field gradient in the read out direction after each of the at least two RF refocusing pulses such that the zeroth and first gradient moment is substantially zero for the second magnetic field gradient, and acquiring the at least two MR spin echoes during the at least two second magnetic field gradients.

19 Claims, 4 Drawing Sheets

MINIMIZATION OF SIGNAL LOSSES IN MULTI-ECHO IMAGING

CROSS-REFERENCE TO RELATED APPLICATIONS

The present application claims the benefit of the filing date of European patent application no. 19165565.3, filed on Mar. 27, 2019, the contents of which are incorporated herein by reference in their entirety.

TECHNICAL FIELD

The present disclosure relates to techniques for acquiring MR signals of an object under examination in an MR system using a multi-echo imaging sequence.

BACKGROUND

In MR imaging systems multi-echo sequences are known in which, after a single RF excitation pulse, several refocusing pulses are applied to generate several spin echoes. This kind of imaging sequence is also known as fast or multi spin echo imaging sequence. However, the use of such multi-echo sequences is prone to destructive interference in fast spin echo measurements.

SUMMARY

A typical sequence diagram is shown in FIG. 1, wherein after one excitation pulse 30 several refocusing pulses 31 to 34 are applied to generate the spin echoes 41 to 43. Gradients in the slice selection direction are applied, such as gradients 50 and 51, wherein gradient 51 already comprises the "crushers" to suppress unwanted signal components, such as the free induction decay (FID). As is known, gradients 60 and 61 having different amplitudes are played out in the phase encoding direction, and the spin echo is acquired during the readout gradients 71, wherein gradient 70 is applied to have a re-phased signal at the echo time. The different RF pulses are played out at the times t0 to t4, as indicated in FIG. 1.

Two problematic effects come along with such a typical realization of fast spin echo sequences:

a) Eddy Currents

In typical realizations, fast spin echo sequences apply many monopolar gradients on the slice and/or the read axis as shown in FIG. 1 and as discussed above. As each gradient ramp can create eddy currents in conducting components of an MRI scanner, this can lead to build-up of eddy current-induced field perturbations over the fast spin echo train and over the entire sequence. Usually, eddy currents created by a gradient ramp are modeled to decay exponentially with a time constant $\tau$:

$$B\_EC = G\, A\, e^{-t/\tau} \qquad \text{Eqn. 1:}$$

Therein, B_EC is the magnetic field generated by the eddy currents, G is the gradient amplitude that belongs to the respective ramp, A is a proportionality constant, and t is the time after the gradient ramp. Assuming a sufficiently long time constant compared to the gradient duration, it can be shown using equation (1) that the eddy current-induced fields are proportional to the time integral of a gradient pulse, which is often also referred to as its 0th moment. Eddy current-induced field perturbations can lead to a number of effects, such as, for example, signal loss due to destructive interference of the different echo configurations, and imperfect fat saturation.

To mitigate these effects, gradient polarity switching can be employed for self-cancellation of eddy currents that have sufficiently long time constants. This technique aims at reducing the total time integral of the gradient pulses (i.e., the 0th moment) and therefore, as mentioned above, to mitigate the resulting eddy current-induced field perturbation.

b) Concomitant Fields

Typical gradients are designed to cause a variation of the static magnetic field B0 in one direction. The main magnetic field is usually aligned in one direction, typically referred to as the z-direction. Then, e.g. the x-gradient shall lead to a variation of the B0 field in the x-direction. However, it follows from Maxwell's equations that the application of gradients gives rise to components of the magnetic field that are not aligned in the z-direction. Further, the magnitude of the z-component of the magnetic field is also affected. These additional field components are referred to as "concomitant fields" or "Maxwell terms" (see e.g. Bernstein, Matt A., King, Kevin F., and Zhou, Xiaohong Joe: "Handbook of MRI pulse sequences", Elsevier, 2004). For cylindrical MR scanners, one can approximate the concomitant fields BC as follows:

$$BC = \frac{1}{2B0}\left[\left(Gxz - \frac{Gzx}{2}\right)^2 + \left(Gyz - \frac{Gzy}{2}\right)^2\right] \qquad \text{Eqn. 2}$$

Therein, B0 is the static magnetic field, x/y/z are the spatial coordinates and Gx/Gy/Gz are the gradients applied in these directions. It follows that the effects decrease with increasing amplitude of the static B0 field.

The time-integral of the concomitant fields causes a phase accumulation, which can lead to destructive interference in fast spin echo measurements. This can happen if the phase accumulation is different for the different echo paths. For instance, the magnetization that forms the stimulated echo can experience a different amount of accumulated phase than the magnetization that forms the spin echo. As the signals of these two "paths" are usually superimposed in fast spin echo measurements from the second echo onwards, a destructive interference of these configurations can cause signal loss. A schematic illustration of this effect is shown in FIG. 2.

As further discussed below, FIG. 2 shows the phase evolution for the normal spin echo path 81, wherein the phase evolution path 82 is provided for the stimulated echo path. The bracket 80 then describes the destructive interference between the stimulated echo path and the spin echo path.

Several solutions exist to counteract the effects described above. In the following, some options that are relevant for the present disclosure are discussed.

1) Eddy Currents

As mentioned above, eddy currents can be suppressed by gradient polarity reversal, known as gradient moment nulling. A common method to achieve this for a selected axis is by balancing gradients, leading to a nulled zeroth and first order gradient moment. For the fast spin echo sequence, these waveforms are used in each interval between subsequent RF pulses. This method is also applied to suppress artefacts from motion, e.g. caused by blood flow. This technique is usually available at commercial MR scanners.

Therefore, it can be easily selected and can be used (albeit this is not its primary focus) to suppress the build-up of long-term eddy current-induced field perturbations. Since the primary focus of this technique is the suppression of motion-induced artefacts, the zeroth and first order gradient moments M0 and M1, being defined as:

$$M0 = \int G(t)dt, \quad M1 = \int G(t) \, t \, dt \quad \text{Eqn. 3:}$$

which are nulled between subsequent RF pulses. Usually, the flow compensation in either slice selection or readout direction can be selected by the user of an MR sequence. A typical sequence diagram of a fast spin echo sequence without and with flow compensation in read direction is shown in FIGS. 3 and 4.

2) Concomitant Fields

A method to avoid signal loss due to destructive interference in fast spin echo measurements caused by concomitant fields is published in U.S. Pat. No. 5,623,207. This patent formulates the basic condition to avoid destructive interference caused by concomitant fields as follows:

$$\int_{t_0}^{t_1} G^2(t)dt = \tfrac{1}{2}\int_{t_1}^{t_2} G^2(t)dt = \ldots = \tfrac{1}{2}\int_{t_{n-1}}^{t_n} G^2(t)dt \quad \text{Eqn. 4:}$$

Figure 1:
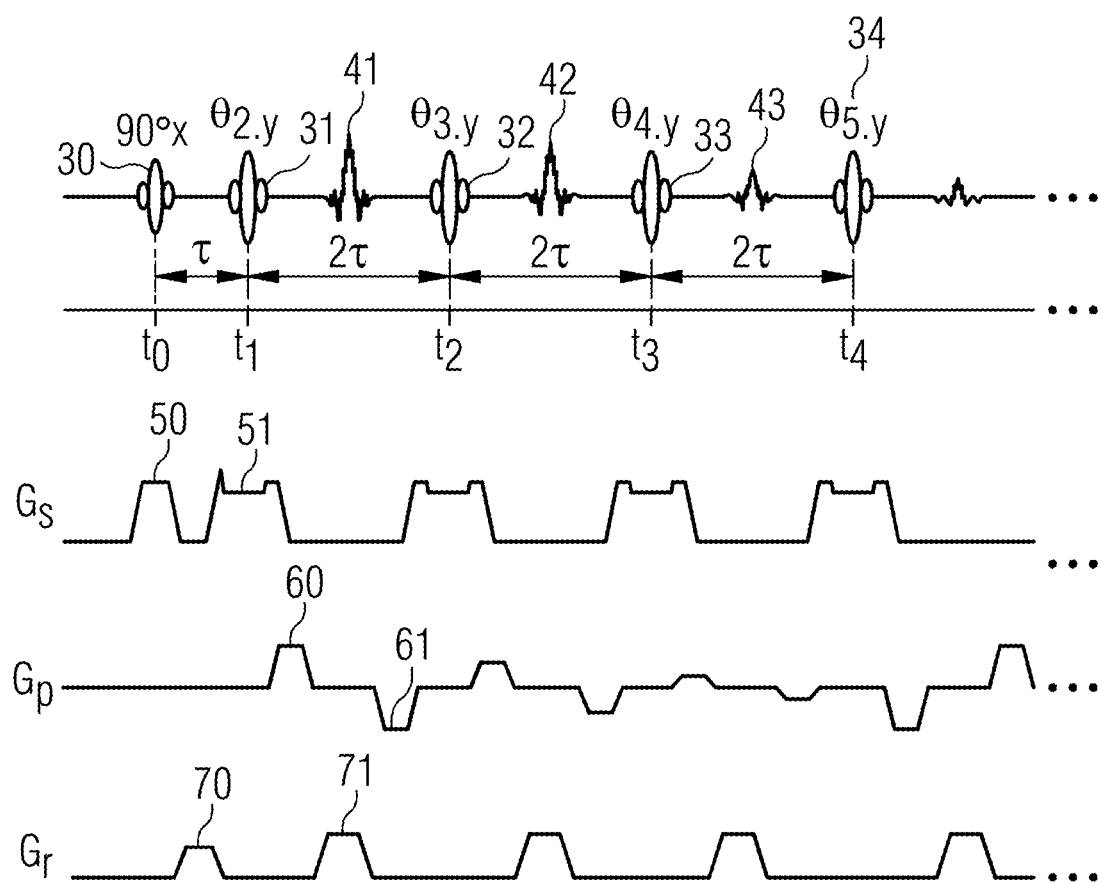

Therein, t0 denotes the time of the excitation RF pulse, the other times t1, t2 . . . denote the time points of the refocusing RF pulses (each time refers to the center of the respective RF pulses), see FIG. 1. G(t) are the applied gradients.

Figure 4:
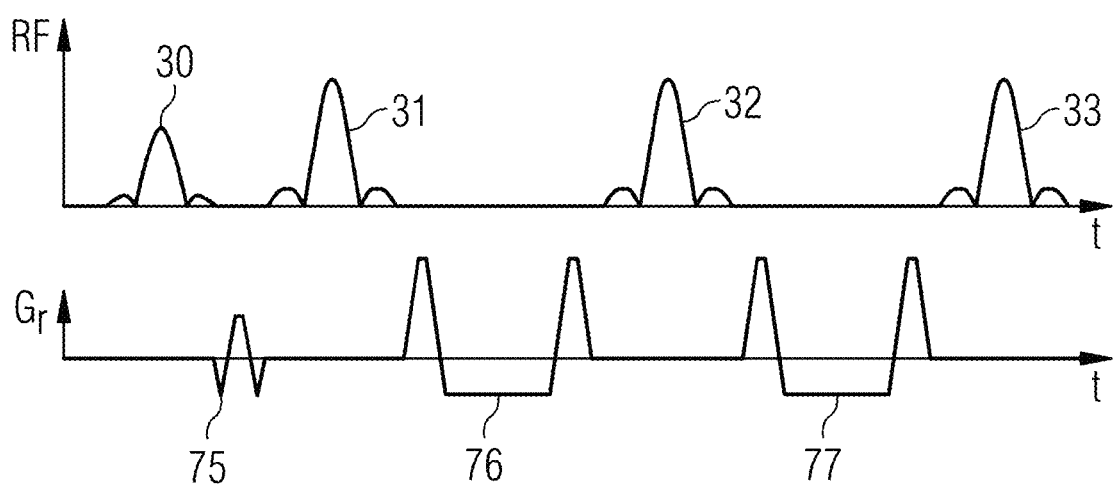
FIG. 4 shows an example with the gradient switching in the readout direction with flow compensation such that the zeroth and the first order gradient moments are zero. With the example shown in FIG. 1, the effects of constant flow on the image signal can be suppressed.

Therefore, current methods to reduce eddy currents include applying nulled gradients between consecutive RF pulses, as it is used by the application of flow compensation. The aforementioned patent gives an instruction to compensate the effects of concomitant fields, which in technical realizations is also applied, at least partly, when flow compensation is active (i.e., to a sequence pattern as shown in FIG. 4). Then, the amplitudes and duration of the gradient lobes that are played out between the excitation RF pulse and the first refocusing RF pulse are chosen to approximate the condition formulated in equation (4). However, it is usually preferred to minimize the echo spacing (which equals the time between the centers of consecutive refocusing RF pulses and also twice the time between the centers of the excitation and first refocusing RF pulse) to minimize scan time and blurring effects that are caused by the T2 decay during an echo train. This limits the time that is usually available for the gradient lobes of this gradient pulse that are played out between the excitation and the first RF refocusing pulses. As a consequence, the integral of the squared gradient amplitude between the excitation and first refocusing RF pulse (between times t0 and t1 in equation (4)) is lower than that required to fulfill equation (4). This can potentially cause image artefacts, e.g. signal loss. A potential measure that is compatible with the current techniques to reduce this effect is to prolong the echo spacing, which in turn increases the time between the excitation and first refocusing RF pulse and allows to increase the mentioned integral.

Accordingly, a need exists to provide a method that improves the compensation of concomitant field-induced effects in combination with minimizing eddy current effects while limiting or avoiding the penalty of prolonged echo spacing. The signal loss in particular should be avoided. This need is met by the aspects as described herein as well as the features of the independent claims. Further aspects and advantages are also described in the dependent claims.

According to a first aspect, a method for acquiring MR signals of an object under examination in an MR system is provided using a multi-echo imaging sequence, wherein an RF excitation pulse is applied to the object under examination to generate a transverse magnetization. Furthermore, at least two RF refocusing pulses are applied to the object for refocusing the transverse magnetization to generate at least two MR spin echoes for the RF excitation pulse. Furthermore, a first magnetic field gradient is applied in the readout direction between the RF excitation pulse and the first of the at least two RF refocusing pulses, wherein the first magnetic field gradient is a bipolar gradient having only one negative gradient lobe and one positive gradient lobe. Furthermore, a second magnetic field gradient is applied in the readout direction after each of the at least two RF refocusing pulses such that the zeroth and the first gradient moment is substantially zero for the second magnetic field gradient. Furthermore, the at least two MR spin echoes are acquired during the second magnetic field gradients (e.g. via the processing circuitry 21, other components of the control unit 20, etc.).

Figure 3:
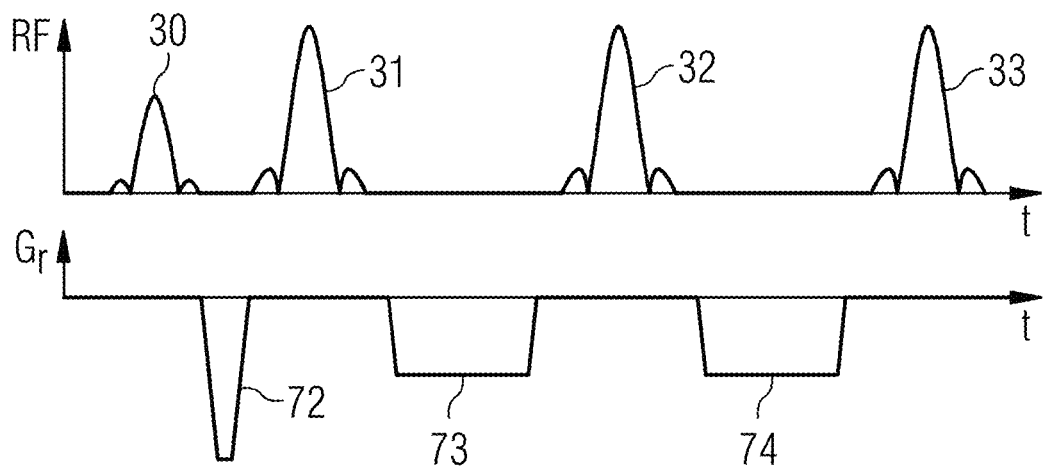
FIG. 3 shows in more detail one option regarding how the gradients in the readout direction 72 to 74 are applied without flow compensation in the readout direction.

The use of the first magnetic field gradient in the readout direction that only has two gradient lobes helps to better fulfill the above specified equation (4), so that especially the integral of the square of the gradient between the RF excitation pulse and the first refocusing pulse can be made larger. Conventionally as shown in FIG. 3, with the gradient switching comprising three different lobes between the RF excitation pulse and the refocusing pulse, a lot of time is lost by ramping from the positive to the negative side and vice versa. As the square of the gradient is the relevant size, the integral obtained over the square of the gradient is much larger when only a bipolar gradient pulse comprising only 2 lobes is used. This helps to minimize the signal losses that would otherwise occur in view of the fact that the above equation (4) is not fulfilled. Even though the gradient switching is not fully flow-compensated in the readout direction anymore for constant flow, the advantages obtained with the use of the above specified first magnetic field gradient more than compensates the incomplete flow compensation.

Preferably, the first magnetic field gradient only consists of the negative gradient lobe and the positive gradient lobe. This means that no further gradient lobe is provided, only a single positive and a single negative lobe, so that we have a non-symmetric bipolar gradient pulse.

For this first magnetic field gradient the zeroth gradient moment is preferably zero but the first gradient moment is not zero. This helps to avoid a signal dephasing at the signal acquisition due to an effective gradient moment due to the gradient switching.

The at least two RF refocusing pulses may be set in the multi-echo imaging sequence such that an echo spacing between the at least two MR spin echoes is larger than a minimum echo spacing that is theoretically possible in the multi-echo imaging sequence in view of the application of the first magnetic field gradient.

Conventionally, the shortest possible echo times are used to minimize the acquisition time. With the use of the first gradient pulse with only two lobes it is possible to obtain a larger integral for the first magnetic field gradient, so that the above-identified equation (4) is even better fulfilled. Accordingly, by increasing the echo spacing compared to the minimum echo spacing that is theoretically possible in view of the requirements of the involved MR system components, such as the switching of the gradients between the 2 refocusing pulses, a slightly higher echo spacing provides a signal increase that has a larger effect compared to the effect that would be obtained when the minimum echo spacing is used.

One option is to determine the size of the first magnetic field gradient such that the difference is smaller than a predefined value d which may be preset in the system:

$$\int_{t0}^{t1} G^2(t)dt - \frac{1}{2}\int_{t1}^{t2} G^2(t)dt < d \qquad \text{Eqn. 5:}$$

Here, the echo spacing is increased such that more time is available for the first gradient pulse so that the size of the switched gradients can be increased to a value that the above-defined difference is smaller than a maximum or absolute deviation or difference d.

As an alternative, it is possible to set the at least two RF refocusing pulses such that the echo spacing is set to a value corresponding to the minimum echo spacing to which a predefined fixed time period is added. Here, the echo spacing is prolonged by a fixed time period in terms of an absolute value or relative value to the available time.

Furthermore, it is possible that the at least two RF refocusing pulses are set in the imaging sequence such that the echo spacing is set to a value corresponding to the minimum echo spacing to which a user-defined time period is added. Here, the user can select the prolongation or the maximum tolerable prolongation of the echo spacing either as an absolute time or a relative time (relative to the available time or echo spacing). The echo spacing may be prolonged by a fixed value such as 1 or 2 ms, or by a relative value, e.g. increased by 10% relative to the minimum echo spacing.

In an aspect, the second magnetic field gradient applied in the readout direction, which is applied during signal acquisition, comprises three different lobes, one lobe with one polarity and two lobes with the opposite polarity.

Furthermore, aspects include the corresponding MR system being provided comprising a control unit configured to control the image acquisition as discussed above or as discussed in further detail below.

Additionally, a computer program comprising program code is provided which, when executed by a control unit of the MR system, causes the MR system to perform a method as discussed above or as described further below.

Furthermore, a carrier comprising the computer program is provided, wherein the carrier is one of an electronic signal, optical signal, radio signal, or a computer readable storage medium. Moreover, aspects include the computer program being provided on a non-transitory computer-readable medium or media, having executable instructions stored thereon. In such a case, the executable instructions, when read by a suitable component of the MR system (e.g. the control unit of the MR system) may cause the MR system to perform the various method aspects and other aspects of the disclosure as described herein.

It should be understood that the features mentioned above and features yet to be explained below can be used not only in the respective combinations indicated, but also in other combinations without departing from the scope of the present application. Features of the above-mentioned aspects and embodiments described below may be combined with each other in other combinations, unless explicitly mentioned otherwise.

BRIEF DESCRIPTION OF THE DRAWINGS/FIGURES

The foregoing and additional features and effects of the application will become apparent from the following detailed description, when read in conjunction with the accompanying drawings, in which like reference numerals refer to like elements.

Further advantages and details of the present disclosure are further explained in the exemplary embodiments described below and by reference to the drawings, in which:

FIG. 1 shows a schematic view of a spin echo imaging sequence known in the art.

Figure 2:
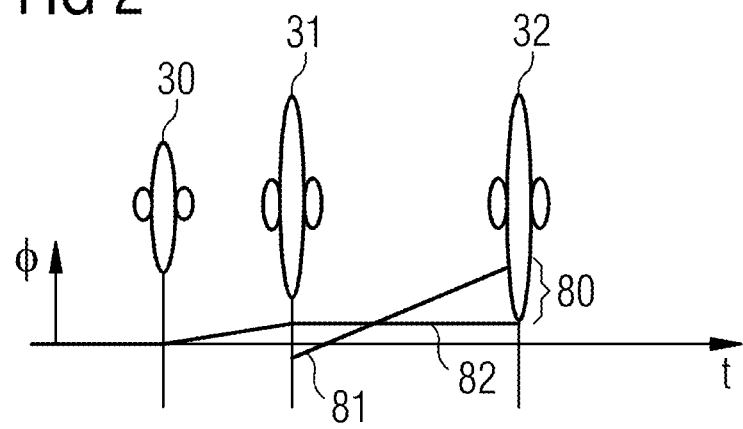

FIG. 2 shows a schematic view of the phase accumulation caused by concomitant fields for the spin echo and the stimulated echo, in accordance with various aspects of the present disclosure.

FIG. 3 shows the readout gradient for a multi-spin echo sequence as known in the art.

FIG. 4 shows the gradient switching as in FIG. 3, however for a flow-compensated imaging sequence, in accordance with various aspects of the present disclosure.

Figure 5:
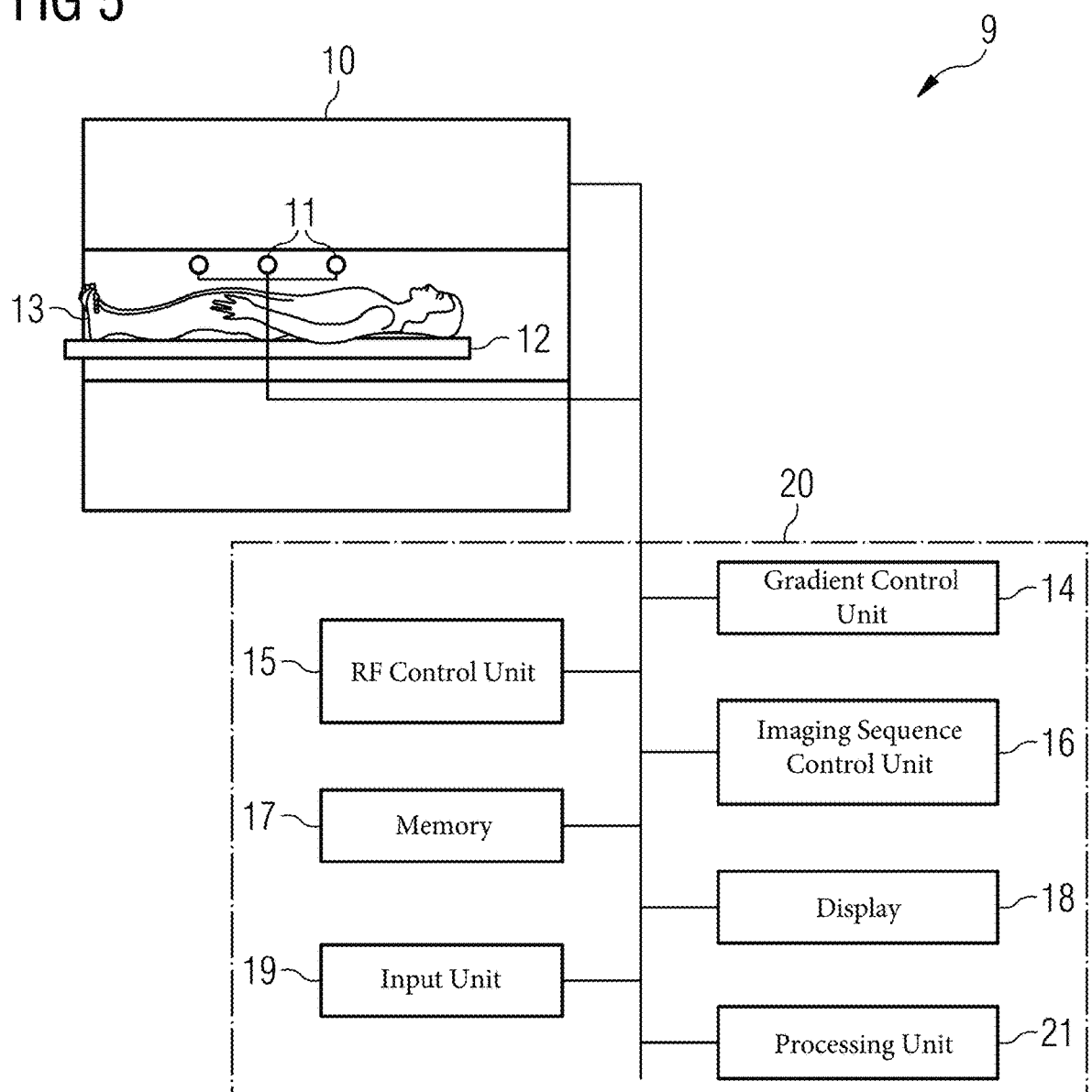

FIG. 5 shows a schematic view of an MR system configured to overcome the signal losses due to concomitant fields while avoiding prolonged echo spacings, in accordance with various aspects of the present disclosure.

Figure 6:
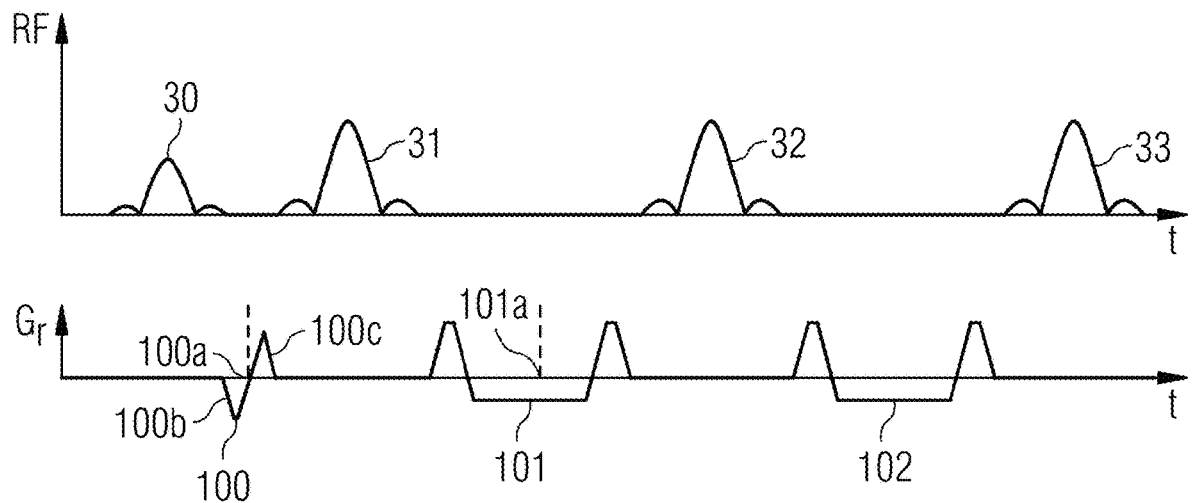

FIG. 6 shows a schematic view of a switching of the gradient in the readout direction and the corresponding RF pulses, in accordance with various aspects of the present disclosure.

Figure 7:
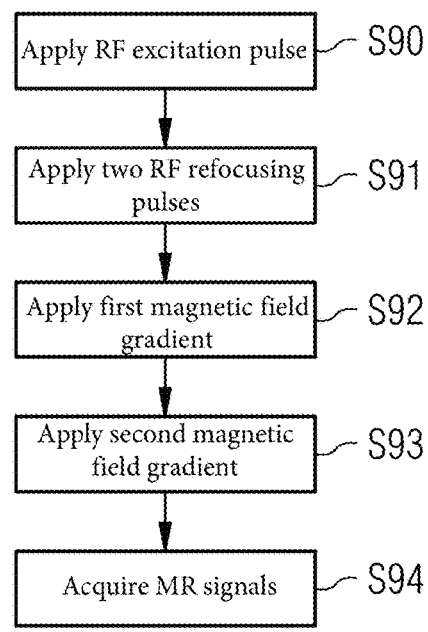

FIG. 7 shows an example schematic flow chart of a method carried out by the MR system to avoid signal losses in a multi-echo imaging sequence, in accordance with various aspects of the present disclosure.

DETAILED DESCRIPTION

In the following, embodiments of the present disclosure will be described in detail with reference to the accompanying drawings. It is to be understood that the following description of embodiments is not to be taken in a limiting sense. The scope of the disclosure is not intended to be limited by the embodiments described hereinafter or by the drawings, which are to be illustrative only.

The drawings are to be regarded as being schematic representations, and elements illustrated in the drawings are not necessarily shown to scale. Rather, the various elements are represented such that their function and general purpose becomes apparent to a person skilled in the art. Any connection or coupling between functional blocks, devices, components of physical or functional units shown in the drawings and described hereinafter may be implemented by an indirect connection or coupling. A coupling between components may be established over a wired or a wireless connection. Functional blocks may be implemented in hardware, software, firmware, or a combination thereof.

FIG. 5 shows a schematic view of an MR system 9, which comprises a magnet 10 generating a polarization field B0. An object under examination 13 lying on a table 12 is moved into the center of the MR system 9, where MR signals after RF excitation can be detected by receiving coils 11 which can comprise different coil sections, wherein each coil section can be associated with a corresponding detection channel By applying RF pulses and magnetic field gradients, the nuclear spins in the object 13, especially the part located in the receiving coil, are excited and location coded and the currents induced by the relaxation can be detected. The way MR images are generated and how MR signals are detected using a sequence of RF pulses and the sequence of magnetic field gradients is known in the art and was discussed inter alia above in connection with FIGS. 1 to 4, so a detailed explanation thereof is omitted.

The MR system 9 comprises a control unit 20 which is used for controlling the MR system. The control unit 20, as well as each component of the control unit 20, may include any suitable number and type of hardware, software, computer processors, or combinations of these. Therefore, the control unit 20 as well as each component of the control unit 20, may alternatively be referred to herein as control circuity 20, gradient control circuitry 14, etc.

The control unit 20 comprises a gradient control unit 14 for controlling and switching the magnetic field gradients, and an RF control unit 15 for controlling and generating the RF pulses for the imaging sequence. An imaging sequence control unit 16 or imaging sequence control circuitry 16 is provided which controls the sequence of the applied RF pulses and magnetic field gradients and thus controls the gradient control unit 14, the RF control unit 15, and the receiving coils 11. In a memory 17, computer programs needed for operating the MR system and the imaging sequences necessary for generating the MR images can be stored together with the generated MR images. The generated MR images can be displayed on a display 18, wherein an input unit or human-machine interface 19 is provided used by a user of the MR system to control the functioning of the MR system. A processing unit 21 or processing circuitry 21 comprising one or more processors which can carry out instructions stored on the memory 17. The memory can furthermore include a suitable program code to be executed by the processing unit 21. The processing unit 21 can, based on the detected images, reconstruct an MR image.

As will be discussed below, the control unit 20, the imaging sequence control unit 16, and/or the processing unit 21 can be configured such that a gradient switching is used in the readout direction which helps to increase the integral over the square of the switched gradients so that the destructive interference between the different echoes is minimized and the same phase evolution occurs for the regular spin echo and the stimulated echo.

As will be explained below, the following combination of the gradient switching for the fast spin echo imaging sequence is proposed:

Between consecutive refocusing RF pulses, a gradient polarity switching is used which aims at reducing or nulling the gradient moments of the zeroth and the first order in order to reduce the eddy current-induced effects. Furthermore, between the excitation RF pulse of the spin echo sequence and the first refocusing RF pulse, a non-symmetric bipolar gradient pulse is used which is also called a first gradient pulse hereinafter, which consists of one positive and one negative gradient lobe. This differs from the application of the conventional flow compensation in which a symmetric bipolar gradient is played out to also compensate the first gradient moment.

FIG. 6 shows a schematic view of the proposed method in accordance with various aspects of the present disclosure. As shown, an RF excitation pulse 30 is followed by several RF refocusing pulses 31 to 33. As far as the readout gradient is concerned, a first magnetic field gradient 100 is applied in the readout direction, which is a non-symmetric bipolar gradient pulse. Non-symmetric means that, relative to the temporal center 100a, the pulse is not symmetric relative to the line going through the temporal center. In the example shown, the first lobe 100b and the second lobe 100c are of opposite polarity. In this context, it is not relevant whether the first lobe is a negative gradient and the second lobe is a positive gradient. However, the area covered by each of the lobes is the same, so that in total the gradient moment is zero after the end of the first magnetic field gradient 100. The following magnetic field gradients, the second field gradients 101 and 102 played out in the readout direction after each of the refocusing pulses are symmetric around the center 101a, as shown in FIG. 6. The usage of gradient 100 can be compared to the gradient switching 75 of FIG. 4, and yield a larger integral of the squared gradient amplitude given that the total time for the gradients is equal. When the gradient switching 100 is compared to gradient switching 75, it can be deduced that less ramp times are needed and that in total, when the same time period is assumed for both gradients, a larger area covered by the lobes can be obtained. This is also directly apparent from the used gradient pulse shapes: If a short echo spacing should be maintained, the gradient between the excitation and the first refocusing RF pulse has to be made short, as its duration may limit the minimum (possible) echo spacing. Other parameters such as, for example, the duration of the gradients between the refocusing pulses may also limit the minimum echo spacing. If only two gradient lobes are used, the integral of the squared gradient as mentioned by equation (4) can be made larger. This helps to maintain the condition of equation (4) as far as possible, or at least to minimize the deviation from this condition.

According to a further aspect, it is possible to increase the echo time spacing compared to the minimum echo spacing that is theoretically possible. With the increased echo time spacing, a larger area covered by the lobes 100b and 100c is possible, so that it is possible to increase the integral of the squared gradient between the excitation and the first RF refocusing pulse. The minimum echo spacing is normally determined by other factors that result from the sequence parameters, such as the duration of the RF pulses, the required time to realize the other required gradients between the RF pulses, etc. For the proposed increase of the echo spacing to have more time available for the first gradient 100, different strategies are possible.

One option is that the system automatically determines the required time to fulfill equation (4) or to achieve the deviation from that condition in a predefined or user-defined way by specifying a maximum relative absolute deviation d.

Another option is to increase the available time or the echo spacing by a fixed time period in terms of an absolute value or a relative value relative to the available time for the echo spacing.

Yet another option is to let the user of the MR system select the prolongation or the maximum tolerable prolongation of the echo spacing or the available time (e.g. via the input unit 19), either as an absolute time or relative to the available time or echo spacing.

FIG. 7 summarizes some of the steps carried out to minimize the signal losses that occur due to eddy currents and concomitant fields in a multi-echo imaging sequence. In a first step S90 an RF excitation pulse is applied to the object 13 and in step S91 two RF refocusing pulses are applied after a single RF excitation pulse to generate the several spin echoes after each excitation pulse. It should be understood that the method steps shown in FIG. 7 need not be carried out in a consecutive way as shown, and FIG. 7 is shown as a manner of summarizing the different aspects used in the imaging sequence. Furthermore, in step S92 a first magnetic field gradient is applied in the readout direction between the RF excitation pulse and the first of the at least two RF refocusing pulses. This first magnetic field gradient 100 is, as shown in FIG. 6, a bipolar gradient having only one negative gradient lobe 100b and only one positive gradient lobe 100c. Furthermore, in step S93 a second magnetic field gradient is applied in the readout direction after each of the at least two RF refocusing pulses such that the zeroth and the first gradient moment are substantially zero as shown in FIG. 6 by gradients 101 and 102. Last but not least, in step S94 the at least two MR signals, e.g. the spin echoes generated after each of the RF refocusing pulses, are acquired.

Summarizing, the image quality of the acquired MR images can be improved by the techniques described above to reduce eddy current-induced effects and destructive interferences caused by concomitant fields simultaneously. In total, the echo spacing and the total scan time for the imaging sequence is unaffected or only marginally affected depending on the realization and depending on the needs of the user. The proposed method can be integrated into existing MR sequences without major efforts and without significantly affecting existing timings and further parameters of the MR imaging sequence.

The technique discussed above provides a particular benefit if one or several of the following conditions are met, e.g. if large readout gradient strengths are used, if an off-center imaging occurs, meaning that the part of the examination object shown in the image is located away from the isocenter of the magnet. Furthermore, at low B0 fields, as here, the effect of the concomitant fields is inversely proportional to the B0 field strength. The proposed method was examined in several patients, and with the conventional approach as shown in FIGS. 3 and 4 a significant signal loss was detected. When the gradient switching as shown in FIG. 6 is used between the excitation and the first RF refocusing pulse and where the timing was otherwise identical to conventional imaging sequences, it was detected that the signal losses were reduced, resulting in a higher signal-to-noise ratio or better contrast. Finally, when the echo spacing was increased compared to the minimum possible echo spacing, e.g. an echo spacing increase of about 10% enabling the application of larger gradient lobes in the first magnetic field gradient 100, an even higher reduction of the signal loss was obtained.

What is claimed is:

1. A method for acquiring magnetic resonance (MR) signals of an object under examination in an MR system using a multi echo imaging sequence, the method comprising:
    applying a radio frequency (RF) excitation pulse to the object under examination to generate a transverse magnetization;
    applying at least two RF refocusing pulses for refocusing the transverse magnetization to generate at least two MR spin echoes for the RF excitation pulse;
    applying a first magnetic field gradient in a read out direction between the RF excitation pulse and a first of the at least two RF refocusing pulses, the first magnetic field gradient being a bipolar gradient having only one negative gradient lobe and only one positive gradient lobe;
    applying a second magnetic field gradient in the read out direction after each respective one of the at least two RF refocusing pulses such that a zeroth order gradient moment and a first order gradient moment of the second magnetic field gradient are zero; and
    acquiring the at least two MR spin echoes during the at least two second magnetic field gradients.

2. The method according to claim 1, wherein a zeroth order gradient moment of the first magnetic field gradient is zero.

3. The method according to claim 1, wherein each of the at least two RF refocusing pulses occur within the multi echo imaging sequence such that an echo spacing between each of the at least two MR spin echoes is larger than a minimum echo spacing associated with the multi echo imaging sequence.

4. The method according to claim 3, wherein a size of the first magnetic field gradient is determined such that:

$$\int_{t_0}^{t_1} G^2(t)dt - \tfrac{1}{2}\int_{t_1}^{t_2} G^2(t)dt < d$$

wherein:
    d represents a predefined value,
    G(t) represents the applied first magnetic field gradient,
    t0 represents a center time of the RF excitation pulse, and
    t1 and t2 represent a center time of each respective one of the at least two RF refocusing pulses.

5. The method according to claim 3, wherein each one of the at least two RF refocusing pulses occur within the multi echo imaging sequence such that the echo spacing is set to a value corresponding to the minimum echo spacing plus a predefined fixed time period.

6. The method according to claim 3, wherein each one of the at least two RF refocusing pulses occur within the multi echo imaging sequence such that the echo spacing is set to a value corresponding to the minimum echo spacing plus a user-defined time period.

7. The method according to claim 1, wherein the second magnetic field gradient comprises three different lobes including one lobe having a first polarity and two lobes each having a second polarity that is an opposite polarity of the first polarity.

8. A magnetic resonance (MR) system configured to acquire MR signals of an object under examination using a multi echo imaging sequence, the MR system comprising:
    imaging sequence control circuitry configured to:
        apply an RF excitation pulse to the object under examination to generate a transverse magnetization,
        apply at least two RF refocusing pulses for refocusing the transverse magnetization to generate at least two MR signal echoes for the RF excitation pulse;
        apply a first magnetic field gradient in a read out direction between the RF excitation pulse and a first of the at least two refocusing pulses, the first magnetic field gradient being a bipolar gradient having only one negative gradient lobe and only one positive gradient lobe;
        apply at least two second magnetic field gradients in the read out direction after each respective one of the at least two RF refocusing pulses such that a zeroth order gradient moment and a first order gradient moment of each of the second magnetic field gradients is zero; and
    processing circuitry configured to acquire the at least two MR signal echoes during the at least two second magnetic field gradients.

9. The MR system according to claim 8, wherein a zeroth order gradient moment of the first magnetic field gradient is zero.

10. The MR system according to claim 8, wherein the imaging sequence control circuitry is configured to apply each of the at least two RF refocusing pulses occurring within the multi echo imaging sequence such that an echo spacing between each of the at least two MR spin echoes is larger than a minimum echo spacing associated with the multi echo imaging sequence.

11. The MR system according to claim 10, wherein a size of the first magnetic field gradient is determined such that:

$$\int_{t0}^{t1} G^2(t)dt - \tfrac{1}{2}\int_{t1}^{t2} G^2(t)dt < d$$

wherein:
d represents a predefined value,
G(t) represents the applied first magnetic field gradient,
t0 represents a center time of the RF excitation pulse, and
t1 and t2 represent a center time of each respective one of the at least two RF refocusing pulses.

12. The MR system according to claim 10, wherein the imaging sequence control circuitry is configured to apply each one of the at least two RF refocusing pulses occurring within the multi echo imaging sequence such that the echo spacing is set to a value corresponding to the minimum echo spacing plus a predefined fixed time period.

13. The MR system according to claim 10, wherein the imaging sequence control circuitry is configured to apply each one of the at least two RF refocusing pulses occurring within the multi echo imaging sequence such that the echo spacing is set to a value corresponding to the minimum echo spacing plus a user-defined time period.

14. The MR system according to claim 8, wherein the second magnetic field gradient comprises three different lobes including one lobe having a first polarity and two lobes each having a second polarity that is an opposite polarity of the first polarity.

15. A non-transitory computer-readable medium of a control unit associated with a magnetic resonance (MR) system, the non-transitory computer-readable medium having instructions stored thereon that, when executed by one or more processors of the control unit, cause the MR system to:
apply an RF excitation pulse to the object under examination to generate a transverse magnetization,
apply at least two RF refocusing pulses for refocusing the transverse magnetization to generate at least two MR signal echoes for the RF excitation pulse;
apply a first magnetic field gradient in a read out direction between the RF excitation pulse and a first of the at least two refocusing pulses, the first magnetic field gradient being a bipolar gradient having only one negative gradient lobe and only one positive gradient lobe;
apply at least two second magnetic field gradients in the read out direction after each respective one of the at least two RF refocusing pulses such that a zeroth order gradient moment and a first order gradient moment of each of the second magnetic field gradients is zero; and
acquire the at least two MR signal echoes during the at least two second magnetic field gradients.

16. The method according to claim 1, wherein an echo spacing between each of the at least two MR spin echoes is equal to a time between respective centers of consecutive refocusing RF pulses of the at least two RF refocusing pulses.

17. The method according to claim 16, wherein the echo spacing between each of the at least two MR spin echoes is equal to twice a time between respective centers of the RF excitation pulse and a first one of the at least two RF refocusing pulses.

18. The method according to claim 1, wherein the first magnetic field gradient applied in the read out direction is asymmetric about a temporal center.

19. The method according to claim 18, wherein the second magnetic field gradient applied in the read out direction after each respective one of the at least two RF refocusing pulses is symmetric about a temporal center.

* * * * *